US012658411B2

(12) United States Patent
    Matsuura

(10) Patent No.:  US 12,658,411 B2
(45) Date of Patent:      Jun. 16, 2026

(54) PLASMA PROCESSING APPARATUS

(71) Applicant: Tokyo Electron Limited, Tokyo (JP)

(72) Inventor: Hiroyuki Matsuura, Iwate (JP)

(73) Assignee: TOKYO ELECTRON LIMITED,
    Tokyo (JP)

( * ) Notice:    Subject to any disclaimer, the term of this
    patent is extended or adjusted under 35
    U.S.C. 154(b) by 124 days.

(21) Appl. No.: 18/388,974

(22) Filed:    Nov. 13, 2023

(65)            Prior Publication Data

US 2024/0170265 A1     May 23, 2024

(30)        Foreign Application Priority Data

Nov. 17, 2022    (JP) ................................. 2022-184424

(51) Int. Cl.
    *H01J 37/32*            (2006.01)
(52) U.S. Cl.
    CPC .. *H01J 37/32568* (2013.01); *H01J 37/32091*
        (2013.01); *H01J 37/32522* (2013.01); *H01J*
        *37/3255* (2013.01); *H01J 37/32715* (2013.01)
(58) Field of Classification Search
    CPC ........... H01J 37/32568; H01J 37/32091; H01J
            37/32522; H01J 37/3255; H01J 37/32715
    See application file for complete search history.

(56)            References Cited

U.S. PATENT DOCUMENTS 5,383,984  A  *  1/1995  Shimada ............. H10P 72/0434
                                        156/345.43
    2007/0186854 A1*  8/2007  Singh ................ H01J 37/32862
                                        134/1.1
    2017/0372916 A1*  12/2017  Kudo ................ H01J 37/32091

FOREIGN PATENT DOCUMENTS

EP        1293588  A9  *  5/2003    ............ H01J 37/321
    JP      2007063640  A  *  3/2007
    JP        4329403  B2    9/2009

* cited by examiner

*Primary Examiner* — Henry Luong
(74) *Attorney, Agent, or Firm* — Venjuris, P.C.

(57)            ABSTRACT

The plasma processing apparatus includes a processing
container, a substrate holder that is inserted into the pro-
cessing container and places a plurality of substrates in
multiple tiers, a rotation shaft that rotates the substrate
holder inside the processing container, a gas supply pipe that
supplies a processing gas into the processing container, an
exhauster that evacuates an inside of the processing con-
tainer, a pair of electrodes arranged outside the processing
container to face each other across a center of the processing
container, and a radio-frequency power supply that applies
radio-frequency power to the pair of electrodes, thereby
generating capacitively-coupled plasma inside the process-
ing container.

13 Claims, 4 Drawing Sheets

PLASMA PROCESSING APPARATUS

CROSS-REFERENCE TO RELATED APPLICATIONS

The present application is based on and claims priority from Japanese Patent Application No. 2022-184424, filed on Nov. 17, 2022, with the Japan Patent Office, the disclosure of which is incorporated herein in its entirety by reference.

TECHNICAL FIELD

The present disclosure relates to a plasma processing apparatus.

BACKGROUND

Japanese Patent No. 4329403 discloses a plasma processing apparatus including a processing container, a wafer boat that holds a plurality of wafers and is inserted into and removed from the processing container, and a plasma generator recessed outward concavely in a part of the sidewall of the processing container to thereby be open at one side to and communicate with the inside of the processing container, the plasma generator being provided along the height direction of the processing container. Radicals generated from the plasma generator are discharged and diffused from an opening of the plasma generator toward the center inside the processing container, thus forming laminar flows between the wafers.

SUMMARY

According to one aspect, a plasma processing apparatus includes a processing container, a substrate holder that is inserted into the processing container and places a plurality of substrates in multiple tiers, a rotation shaft that rotates the substrate holder inside the processing container, a gas supply pipe that supplies a processing gas into the processing container, an exhaust unit that evacuates an inside of the processing container, a pair of electrodes that is arranged outside the processing container to face each other across a center of the processing container, and a radio-frequency power supply that applies radio-frequency power to the pair of electrodes, thereby generating a capacitively-coupled plasma inside the processing container.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
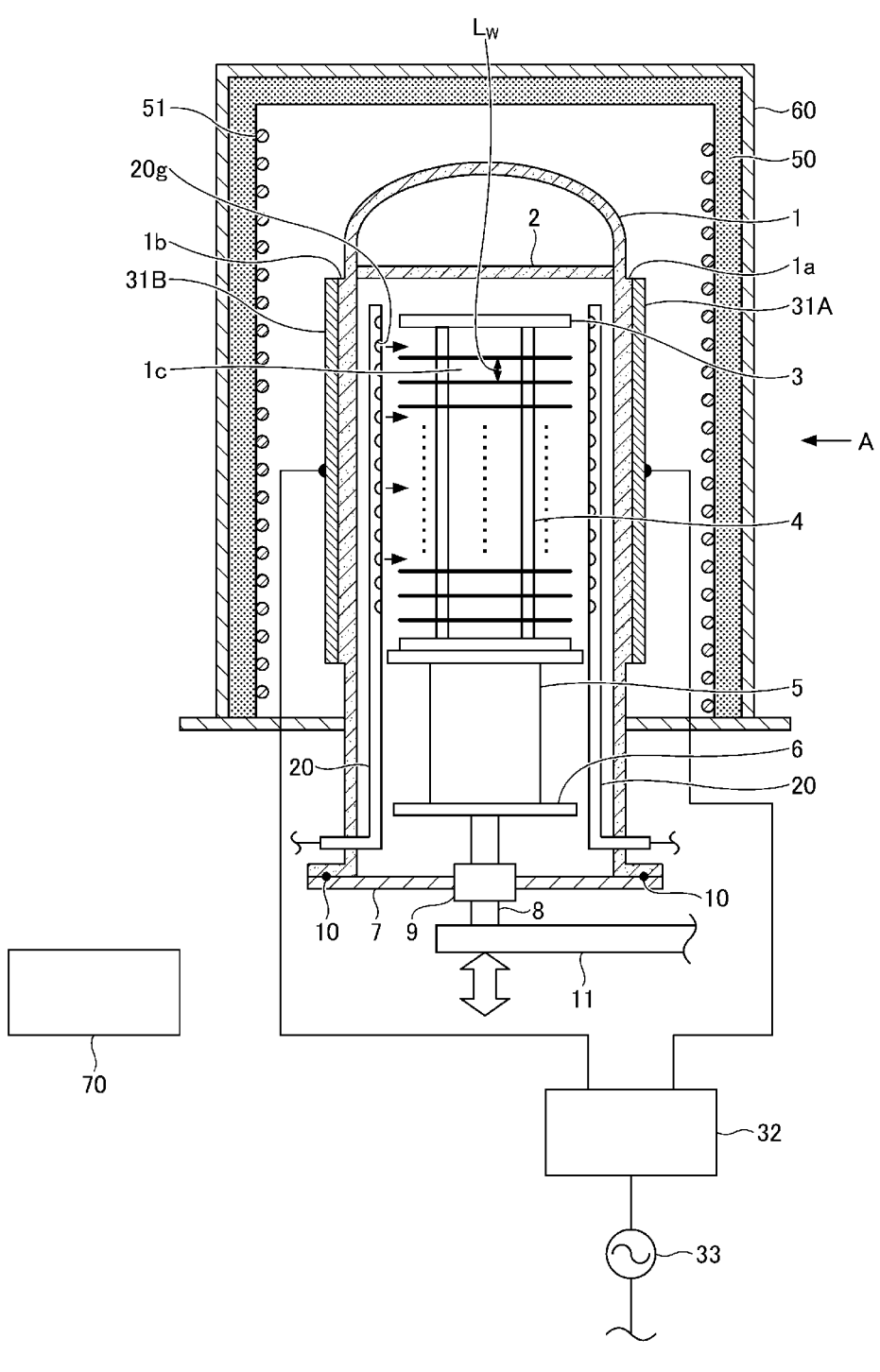
FIG. 1 is a longitudinal cross-sectional diagram illustrating an example of a plasma processing apparatus.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the drawings. In each drawing, the same reference numerals may be given to the same components, and redundant descriptions may be omitted.

[Plasma Processing Apparatus]

Figure 2:
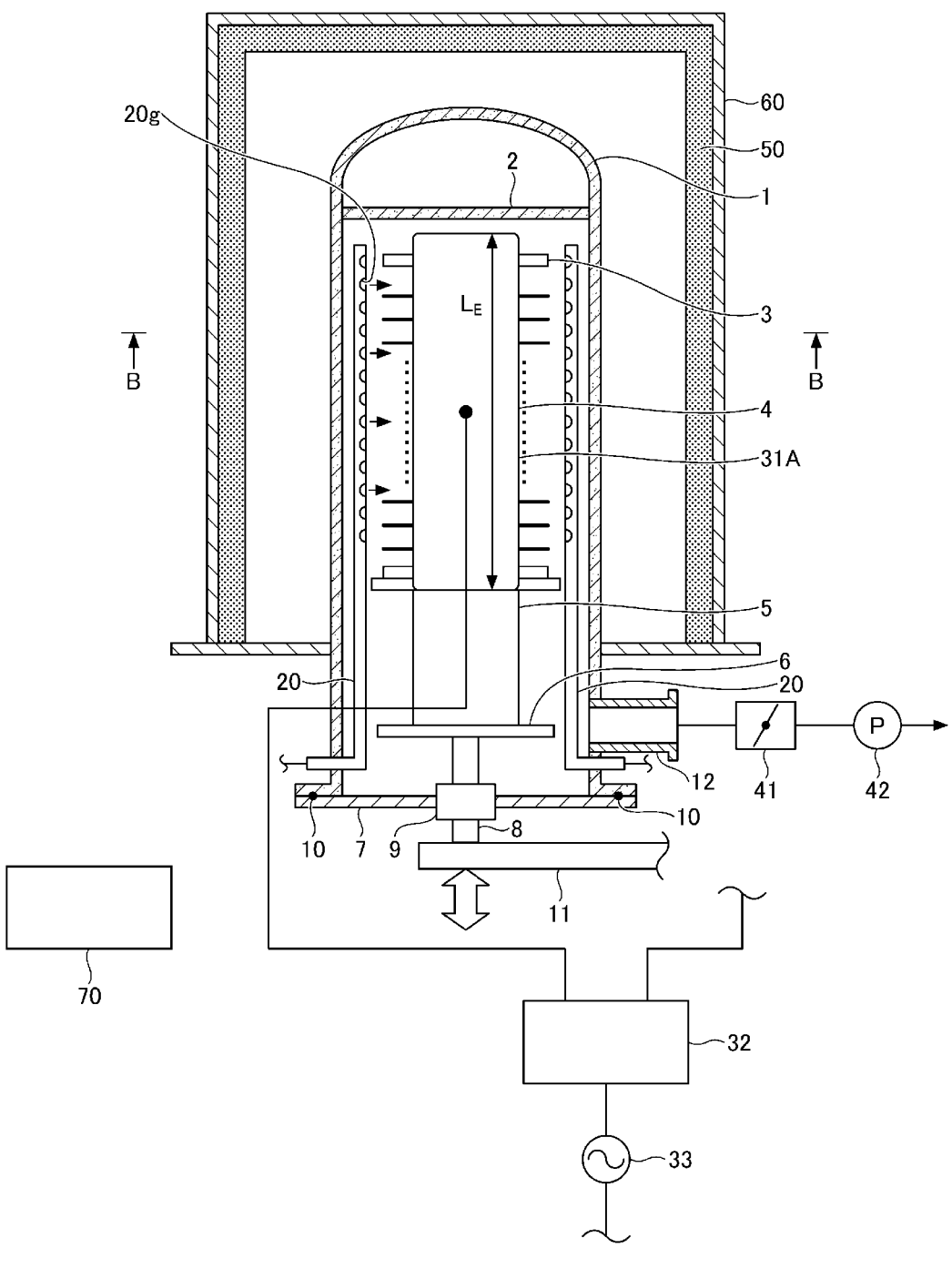
FIG. 2 is a longitudinal cross-sectional diagram illustrating the example of the plasma processing apparatus as viewed from the direction of arrow A.
Figure 3:
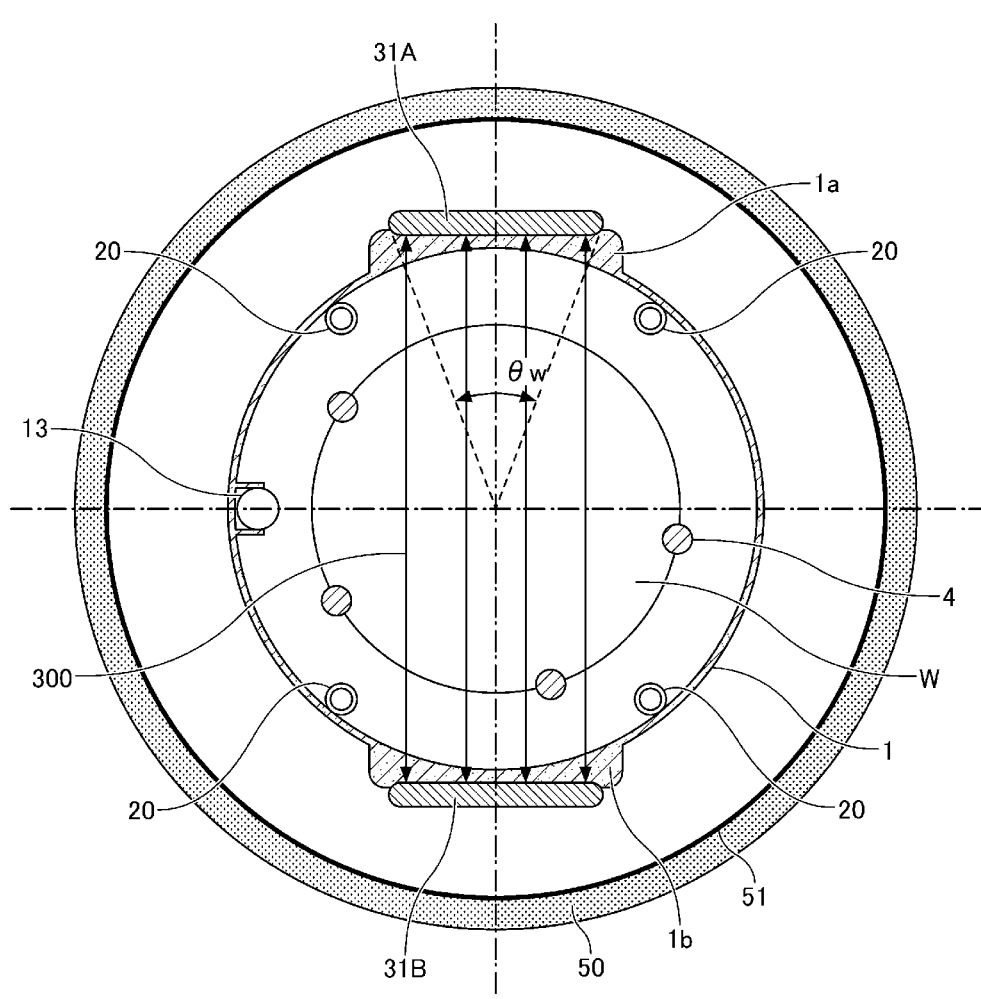
FIG. 3 is a cross-sectional diagram illustrating the example of the plasma processing apparatus taken along line B-B.

A plasma processing apparatus (substrate processing apparatus) according to the present embodiment will be described with reference to FIGS. 1 to 3. FIG. 1 is a longitudinal cross-sectional diagram illustrating an example of a plasma processing apparatus. FIG. 2 is a longitudinal cross-sectional diagram illustrating the example of the plasma processing apparatus as viewed from the direction of arrow A illustrated in FIG. 1. FIG. 3 is a cross-sectional diagram illustrating the example of the plasma processing apparatus taken along line B-B illustrated in FIG. 2. The plasma processing apparatus illustrated in FIGS. 1 to 3 is a batch type plasma processing apparatus that performs a substrate processing (e.g., film formation processing, etc.) on a plurality of substrates W.

The plasma processing apparatus includes a ceilinged cylindrical processing container 1 with an open bottom. The entire processing container 1 is made of, for example, quartz. A ceiling plate 2, which is made of quartz, is provided near the top inside the processing container 1, and a region under the ceiling plate 2 is sealed.

The lower side of the processing container 1 is open, and a wafer boat (substrate holder) 3, in which a plurality of (e.g., from a few to about 100 sheets) semiconductor wafers (hereinafter referred to as "substrates W") as processing target substrates are placed in multiple tiers, is inserted into the processing container 1 from below of the processing container 1. As such, the plurality of substrates W are accommodated approximately horizontally with a spacing $1c$ corresponding to a gap $L_W$ along the vertical direction inside the processing container 1. The wafer boat 3 is made of, for example, quartz. The wafer boat 3 has four rods 4 (see, e.g., FIG. 3, and two rods are illustrated in FIGS. 1 and 2), and the plurality of substrates W are supported by grooves (not illustrated) formed in the rods 4.

The wafer boat 3 is disposed above a table 6 via a heat reservoir 5, which is made of quartz. The table 6 is supported on a rotation shaft 8, which penetrates a metallic (e.g., stainless steel) lid 7 that opens and closes a bottom opening of the processing container 1.

A magnetic fluid seal 9 is provided around a penetrating portion of the rotation shaft 8 to airtightly seal and rotatably support the rotation shaft 8. A seal member 10 for maintaining the airtightness inside the processing container 1 is provided between a peripheral portion of the lid 7 and the bottom of processing container 1.

The rotation shaft 8 is attached to the tip of an arm 11, which is supported by an elevating mechanism (not illustrated) such as, for example, a boat elevator. The wafer boat 3 and the lid 7 are integrally moved up and down and are inserted into or removed from the processing container 1. The table 6 may be fixed at the lid 7 side, so that the substrates W may be processed without rotating the wafer boat 3.

Further, the plasma processing apparatus 100 includes a gas supply that supplies predetermined gases such as a processing gas and a purge gas into the processing container 1.

The gas supply includes a gas supply pipe 20. The gas supply pipe 20 is made of, for example, quartz, and inwardly penetrates the sidewall of the processing container 1 to be bent upward and extend vertically. A plurality of gas holes 20g are formed at a predetermined interval in a vertical portion of the gas supply pipe 20 over a vertical length corresponding to the wafer supporting range of the wafer boat 3. Each gas hole 20g discharges a gas in the horizontal direction. A processing gas is supplied to the gas supply pipe 20 from a gas source (not illustrated) through a gas pipe. The gas pipe is provided with a flow controller (not illustrated) and an on-off valve (not illustrated). Thus, the processing gas from the gas source is supplied into the processing container 1 through the gas pipe and the gas supply pipe 20. The flow controller is configured to control the flow rate of the gas supplied from the gas supply pipe 20 into the processing container 1. The on-off valve is configured to control the supply/stop of the gas supplied from the gas supply pipe 20 into the processing container 1.

FIG. 3 illustrates four gas supply pipes 20, but the number of gas supply pipes 20 is not limited thereto. Further, the four gas supply pipes 20 may be configured to supply different gases into the processing container 1, respectively, or at least two or more gas supply pipes 20 may be configured to supply the same gas into the processing container 1.

A pair of electrodes 31A and 31B are provided outside the processing container 1. The pair of electrodes 31A and 31B are formed of a flat plate, respectively, and are mounted on electrode mounts 1a and 1b provided outside the processing container 1. Further, the pair of electrodes 31A and 31B are arranged to face each other across the center of the processing container 1 (the center of the substrates W supported by the wafer boat 3). That is, the electrodes 31A and 31B are arranged at positions rotated by 180° in the circumferential direction of the processing container 1. Further, the pair of electrodes 31A and 31B are arranged parallel to each other. The electrode mounts 1a and 1b may be formed integrally with the processing container 1, or may be formed separately.

The electrodes 31A and 31B are made of a good conductor such as a metal. Further, a nickel alloy may be used as a material of the electrodes 31A and 31B. By using the nickel alloy as the material of the electrodes 31A and 31B, it is possible to prevent the influence of metal contamination to the processing container 1 (diffusion of metal atoms to the processing container 1 made of quartz) compared to a case of using copper as the material of the electrodes 31A and 31B. Further, the nickel alloy has high heat resistance that is available within the available temperature range of the plasma processing apparatus (the range of a heating temperature by a heating mechanism 50 to be described later, for example, from room temperature to 900° C.). Further, the nickel alloy has oxidation resistance.

Each of the electrodes 31A and 31B is connected to a radio-frequency power supply 33 via an impedance matcher 32. The radio-frequency power supply 33 and the impedance matcher 32 constitute a radio-frequency control system. The radio-frequency control system applies impedance-matched radio-frequency power to each of the electrodes 31A and

31B. FIGS. 1 and 2 illustrate that radio-frequency power is supplied from a set of the impedance matcher 32 and the radio-frequency power supply 33 to each of the electrodes 31A and 31B, but is not limited to this configuration. In an alternative configuration, the impedance matcher 32 and the radio-frequency power supply 33, which supply radio-frequency power to the electrode 31A, may be separately provided from the impedance matcher 32 and the radio-frequency power supply 33 which supply radio-frequency power to the electrode 31B.

Power supply lines of the electrodes 31A and 31B may be connected to the center of the respective electrodes. Thus, radio-frequency power is applied to the center of the electrodes 31A and 31B.

The frequency of radio-frequency power applied to the electrodes 31A and 31B may be within the range of 1 kHz to 100 MHz. Further, to prevent the influence of wavelengths of voltage standing waves generated on the electrodes to the film formation processing (substrate processing), a frequency of 40 MHz or less may be used as the frequency of radio-frequency power applied to the electrodes 31A and 31B.

The inside of the processing container 1 is evacuated and is maintained at a reduced pressure (vacuum atmosphere) by an exhaust device 42 to be described later. Further, the processing gas is supplied to the inside of the processing container 1 from the gas supply pipe 20. Meanwhile, the outside of the processing container 1 is under an air atmosphere. The electrodes 31A and 31B are arranged in an atmospheric space outside the processing container 1.

When applying radio-frequency power to each of the electrodes 31A and 31B from each radio-frequency power supply 33, an electric field is created inside the processing container 1, and a capacitively-coupled plasma (CCP) is generated inside the processing container 1.

As illustrated in FIGS. 1 and 2, the electrodes 31A and 31B are arranged in the height direction over a wider range than a range in the height direction of the plurality of substrates W placed in the wafer boat 3. In other words, the width $L_E$ in the height direction of the electrodes 31A and 31B is greater than the range in the height direction of the plurality of substrates W placed in the wafer boat 3. That is, the electrodes 31A and 31B are formed up to a position higher than the uppermost substrate W placed in the wafer boat 3 and down to a position lower than the lowest substrate W placed in the wafer boat 3.

As illustrated in FIG. 3, an angle $\theta_W$ formed by connecting both horizontal ends of the electrode 31A in the width direction (horizontal direction) of the electrode 31A to the center of the processing container 1 (the center of the substrates W supported by the wafer boat 3) is within the range of 20° to 60°. Further, the angle $\theta_W$ may be particularly within the range of 25° to 40°.

Further, the width of the electrode 31B is the same as the width of the electrode 31A. Further, the pair of electrodes 31A and 31B are arranged to face each other across the center of the processing container 1 (the center of the substrates W supported by the wafer boat 3) and are also arranged parallel to each other. Thus, an electric field direction 300 created by the two electrodes 31A and 31B is indicated by the arrows in FIG. 3. As illustrated in FIG. 3, a uniform electric field may be created on the substrates W.

Further, in a relationship between the heating mechanism 50 (heater wire 51) to be described later and the processing container 1, the electrodes 31A and 31B are in charge of shielding radiant heat from the heating mechanism 50 (heater wire 51) to the processing container 1. Therefore, the circumferential length of the processing container 1 shielded by the electrodes 31A and 31B may be, for example, equal to or less than ⅓ of the entire circumference. In other words, the angle $\theta_W$ may be equal to or less than 60°. Further, the angle $\theta_W$ may be within the range of 25° to 60° in consideration of, e.g., the power density of the electrodes 31A and 31B.

An exhaust port 12 for the evacuation of the inside of the processing container 1 is provided on a sidewall portion of the processing container 1. An exhaust device (exhauster) 42, which includes, e.g., a pressure control valve 41 for controlling the internal pressure of the processing container 1 and a vacuum pump, is connected to the exhaust port 12. The inside of the processing container 1 is evacuated by the exhaust device 42 via an exhaust pipe.

Further, a thermocouple 13 is disposed along the inner wall surface of the processing container 1 inside the processing container 1. A plurality of thermocouples 13 are provided in the height direction. A controller 70 controls temperature detection using the thermocouples 13, and the detected temperature is used to control the temperature of the substrates W.

Further, as illustrated in FIG. 3, the gas supply pipe 20 and the thermocouples 13 are disposed to avoid the electric field (the range of the electric field direction 300) created by the electrodes 31A and 31B.

The cylindrical heating mechanism 50 is provided around the processing container 1. The heating mechanism 50 includes a wound heater wire 51. The heater wire 51 is disposed to surround the processing container 1 and the plurality of electrodes 31A and 31B. A space between the heating mechanism 50 and the processing container 1 is under an air atmosphere, and the electrodes 31A and 31B are arranged in this space. The heating mechanism 50 heats the processing container 1 and the substrates W therein. The heating mechanism 50 controls the temperature of the processing container 1 to reach a desired temperature. Thus, the substrates W inside the processing container 1 are heated by, e.g., radiant heat from the wall surface of the processing container 1. The temperature of the processing container 1 heated by the heating mechanism 50 is, for example, within the range of room temperature to 900° C. Further, in the film formation processing, the temperature of the processing container 1 is, for example, within the range of 150° C. to 600° C. Further, for example, the temperature of the processing container 1 within the range of 200° C. to 500° C. is suitably used in the film formation processing.

Further, a shield 60 is provided outside the heating mechanism 50. That is, the shield 60 is disposed to surround the processing container 1, the plurality of electrodes 31A and 31B, and the heating mechanism 50. The shield 60 is made of a good conductor such as a metal, and is grounded.

Further, the plasma processing apparatus includes controller 70. The controller 70 controls, for example, the operation of each part of the plasma processing apparatus such as the supply/stop of each gas by the opening and closing of the on-off valve, the control of the gas flow rate by the flow controller, and the control of evacuation by the exhaust device 42. Further, the controller 70 controls, for example, the on/off of radio-frequency power by the radio-frequency power supply 33 and the temperature of the processing container 1 and the substrates W therein by the heating mechanism 50.

The controller 70 may be, for example, a computer, among others. Further, computer programs that execute the operation of each part of the plasma processing apparatus are stored in a storage medium. The storage medium may be, for example, a flexible disk, compact disk, hard disk, flash memory, DVD, or the like.

With this configuration, the plasma processing apparatus reduces the internal pressure of the processing container 1 by the exhaust device 42, supplies the processing gas from the gas supply pipe 20 into the processing container 1, and applies radio-frequency power to the electrode 31A and 31B, thereby generating a capacitively-coupled plasma (CCP) inside the processing container 1 and performing a processing (film formation processing, etching processing, etc.) on the substrates W. Further, the capacitively-coupled plasma is also generated in the space 1c between the substrates W. This allows for improving the uniformity of radicals or active species generated by the plasma in a central portion and outer peripheral portion of the substrates W. Further, it is possible to generate a sufficient concentration of radicals or active species for a substrate processing and to supply them to the central portion and outer peripheral portion of the substrates W.

Figure 4:
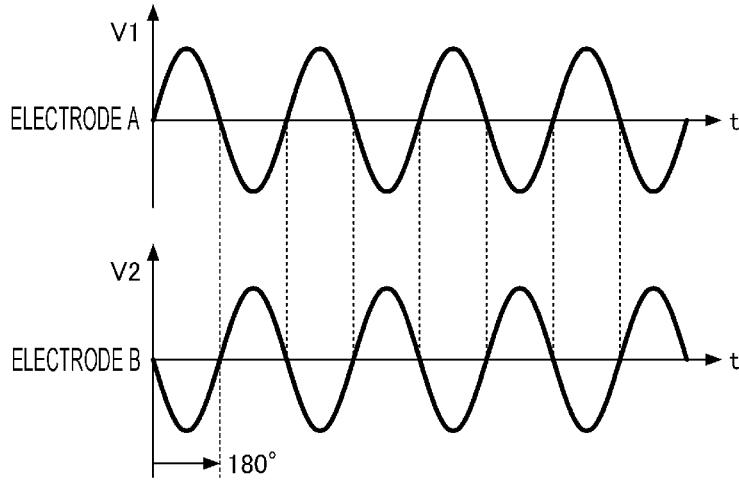
FIG. 4 is an example of a graph illustrating radio-frequency power applied to each electrode.

FIG. 4 is a graph illustrating an example of radio-frequency power applied to each of the electrodes 31A and 31B. In the upper graph, the horizontal axis represents the time, and the vertical axis represents the voltage applied to the electrode 31A. In the lower graph, the horizontal axis represents the time, and the vertical axis represents the voltage applied to the electrode 31B.

As illustrated in FIG. 4, the radio-frequency power applied from the impedance matcher 32 to the electrodes 31A and 31B is in antiphase (with a phase difference of 180°) and has the same voltage amplitude and frequency. In other words, the matching circuit of the impedance matcher 32 is determined so that the voltage is in antiphase (with a phase difference of 180°) and has the same voltage amplitude and frequency. This allows for achieving a high Vpp (maximum amplitude difference of electrode voltages) with low power.

Figure 5:
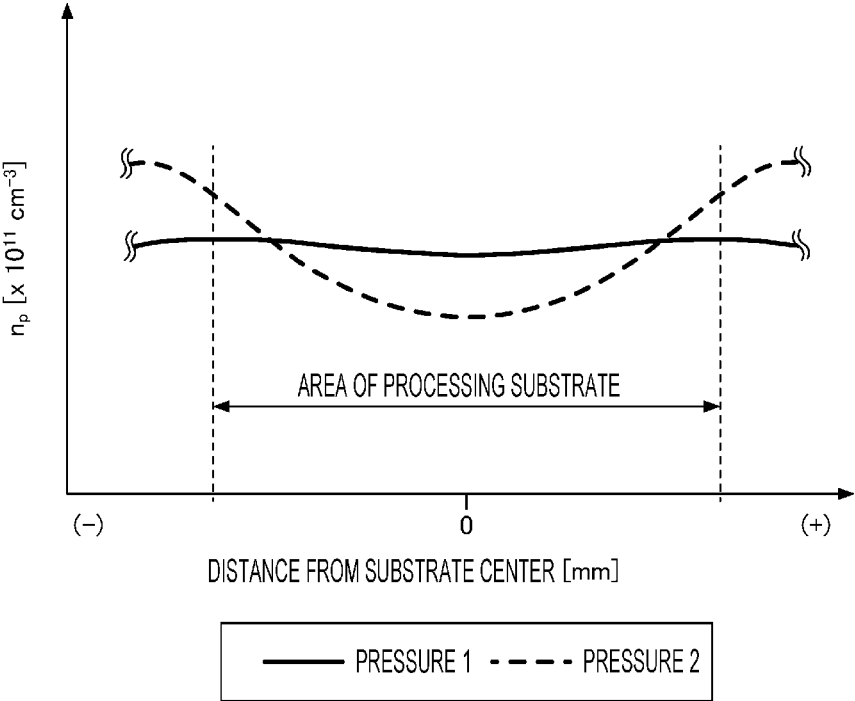
FIG. 5 is a graph illustrating an example of plasma density in an area where a substrate is disposed between electrodes.

FIG. 5 is a graph illustrating an example of plasma density in an area where a substrate is disposed between electrodes. Here, there is illustrated an example of plasma density (electron density) when radio-frequency power of 13.56 MHz is applied to the electrodes 31A and 31B to generate an argon (Ar) plasma inside the processing container 1 without the substrates W accommodated inside the processing container 1. The horizontal axis represents the distance from the center of the substrates W, the positive direction is the direction toward one electrode 31A, and the minus direction is the direction toward the other electrode 31B. The vertical axis represents the density of the generated plasma. The plasma density near the electrodes 31A and 31B is omitted.

The solid line represents the plasma density at Pressure 1. The broken line represents the plasma density at Pressure 2, which is different from Pressure 1. There is a magnitude relationship of "Pressure 1<Pressure 2." As illustrated in FIG. 5, by changing the pressure, it is possible to alter the distribution of plasma density in the radial direction of the substrates W. In other words, controlling the pressure allows for improving the uniformity of plasma density in the radial direction of the substrates W.

Specifically, in a hydrogen plasma, the internal pressure of the processing container 1 may be 25 Pa or less, particularly 15 Pa or less. This allows for improving the uniformity of plasma density in the radial direction of the substrates W.

Further, the heat reservoir 5 and the wafer boat 3 are rotated by the rotation shaft 8. This allows for improving the uniformity of a substrate processing (plasma processing) in the circumferential direction of the substrates W.

The plurality of substrates W inside the processing container 1 are held by the wafer boat 3 with a space in the height direction. Further, a capacitively-coupled plasma is generated inside the processing container 1 by applying radio-frequency power to the electrodes 31A and 31B. That is, the plasma is generated in the space between the substrates W. Here, the gap $L_W$ between the substrates W may be equal to or more than 10 mm. This allows for improving the in-plane uniformity of plasma generated in the space between the substrates W. Further, the gap between the substrates may be within the range of 15 mm to 40 mm in consideration of the productivity of the substrate processing by the plasma processing apparatus and the size of the processing container 1.

Further, when generating a plasma using, as the processing gas, a gas containing hydrogen (H) such as hydrogen or ammonia, synthetic quartz glass having an OH group concentration of 200 ppm or more may be used as at least a material of the electrode mounts 1a and 1b.

Here, active species containing ions or hydrogen generated in the plasma of the gas containing hydrogen (H) cause sputtering or etching of the inner wall of the processing container 1 in the electrode mounts 1a and 1b, leading to transformation of the inner wall into a silicon-rich surface. A significant stress may occur at the boundary between the transformed inner wall portion (electrode mounts 1a and 1b) and the other unaffected inner wall portion, potentially resulting in damage to the processing container 1. Meanwhile, by using synthetic quartz glass having an OH group concentration of 200 ppm or more for at least the electrode mounts 1a and 1b, it is possible to prevent sputtering or etching and to prevent transformation into a silicon-rich surface, thereby preventing damage to the processing container 1.

Further, due to the spluttering or etching of the inner wall of the processing container 1 in the electrode mounts 1a and 1b by the plasma, using synthetic quartz glass having an OH group concentration of 200 ppm or more for the inner wall of the processing container 1 in the electrode mounts 1a and 1b or for the entire processing container 1 may relatively reduce the level of metal contamination derived from quartz compared to using molten quartz glass made from natural quartz as a raw material.

According to one aspect, it is possible to provide a plasma processing apparatus that generates a plasma on a substrate to perform a processing on the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a processing container;
a substrate holder inserted into the processing container and configured to place a plurality of substrates in multiple tiers;
a rotation shaft configured to rotate the substrate holder inside the processing container;
a gas supply pipe configured to supply a processing gas into the processing container;
an exhauster configured to evacuate an inside of the processing container;

a pair of electrodes formed of flat plates, respectively and arranged outside the processing container to face each other across a center of the processing container; and
a radio-frequency power supply configured to apply radio-frequency power to the pair of electrodes, thereby generating capacitively-coupled plasma inside the processing container,
wherein the processing container includes a pair of electrode mounts each protruding outwardly from a side wall of the processing container, and the pair of electrodes are provided on the pair of electrode mounts, respectively.

2. The plasma processing apparatus according to claim 1, wherein the radio-frequency power applied to the pair of electrodes is in antiphase and has an equal amplitude.

3. The plasma processing apparatus according to claim 1, wherein an angle formed by connecting both horizontal ends of each electrode and the center of the processing container is within a range of 20° to 60°.

4. The plasma processing apparatus according to claim 3, wherein the angle formed by connecting both the horizontal ends of the electrode and the center of the processing container is within a range of 25° to 40°.

5. The plasma processing apparatus according to claim 1, wherein a plurality of electrodes are arranged over a wider range than a range in a height direction of the plurality of substrates placed on the substrate holder.

6. The plasma processing apparatus according to claim 1, wherein a gap in a height direction between the substrates held by the substrate holder is equal to or more than 10 mm.

7. The plasma processing apparatus according to claim 1, wherein a gap in a height direction between the substrates held by the substrate holder is in a range of 15 mm to 40 mm.

8. The plasma processing apparatus according to claim 1, wherein an internal pressure of the processing container is equal to or less than 25 Pa when generating hydrogen plasma inside the processing container.

9. The plasma processing apparatus according to claim 8, wherein the internal pressure of the processing container is equal to or less than 15 Pa when generating the hydrogen plasma inside the processing container.

10. The plasma processing apparatus according to claim 1, wherein the pair of electrodes are made of nickel alloy.

11. The plasma processing apparatus according to claim 1, further comprising a heater configured to surround the processing container and the pair of electrodes.

12. A plasma processing apparatus comprising:
a processing container;
a substrate holder inserted into the processing container and configured to place a plurality of substrates in multiple tiers;
a rotation shaft configured to rotate the substrate holder inside the processing container;
a gas supply pipe configured to supply a processing gas into the processing container;
an exhauster configured to evacuate an inside of the processing container;
a pair of electrodes formed of flat plates, respectively and arranged outside the processing container to face each other across a center of the processing container; and
a radio-frequency power supply configured to apply radio-frequency power to the pair of electrodes, thereby generating capacitively-coupled plasma inside the processing container,
wherein the pair of electrodes are formed of synthetic quartz glass having an OH group concentration of 200 ppm or more.

13. A plasma processing apparatus comprising:

a processing container;

a substrate holder inserted into the processing container and configured to place a plurality of substrates in multiple tiers;

a rotation shaft configured to rotate the substrate holder inside the processing container;

a gas supply pipe configured to supply a processing gas into the processing container;

an exhauster configured to evacuate an inside of the processing container;

a pair of electrodes formed of flat plates, respectively and arranged outside the processing container to face each other across a center of the processing container; and a radio-frequency power supply configured to apply radio-frequency power to the pair of electrodes, thereby generating capacitively-coupled plasma inside the processing container, wherein a circumferential length of the processing container that is shielded by the pair of electrodes is equal to or less than ⅓ of an entire circumferential length of the processing container.

* * * * *